(12) United States Patent
Desabhatla et al.

(10) Patent No.: US 10,739,405 B2
(45) Date of Patent: Aug. 11, 2020

(54) DYNAMOELECTRIC MACHINE FAULT MONITORING SYSTEM, COMPUTER PROGRAM PRODUCT AND RELATED METHODS

(71) Applicant: General Electric Company, Schenectady, NY (US)

(72) Inventors: Sreedhar Desabhatla, Munich (DE); James Jonathan Grant, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 650 days.

(21) Appl. No.: 15/471,366

(22) Filed: Mar. 28, 2017

(65) Prior Publication Data
US 2017/0292996 A1  Oct. 12, 2017

Related U.S. Application Data

(60) Provisional application No. 62/320,664, filed on Apr. 11, 2016.

(51) Int. Cl.
*G01R 31/34* (2020.01)
*H02P 6/32* (2016.01)
(Continued)

(52) U.S. Cl.
CPC ......... *G01R 31/343* (2013.01); *G01R 31/346* (2013.01); *H02K 11/20* (2016.01);
(Continued)

(58) Field of Classification Search
None
See application file for complete search history.

(56) References Cited

U.S. PATENT DOCUMENTS 5,565,752 A * 10/1996 Jansen ............... H02K 17/165
310/169
6,035,265 A * 3/2000 Dister ................ G01R 31/343
324/765.01
(Continued)

FOREIGN PATENT DOCUMENTS

EP   2 851 698 A1   3/2015

OTHER PUBLICATIONS

Messtechnik, S., "MR 270 C-A designed 1-10 for the cable industy High precision resistance meters," Retrieved rrom the Internet URL: http://schuetzmesstechnik.de/wp-content/uploads/2016/12/KenMR270CA.pdf, pp. 1-2 (Aug. 2012).
(Continued)

*Primary Examiner* — Lina M Cordero
(74) *Attorney, Agent, or Firm* — James Pemrick; Hoffman Warnick LLC

(57) ABSTRACT

Various embodiments include a system having: at least one computing device configured to monitor a dynamoelectric machine having a rotor including an exciter electrically coupled with a field winding, by performing actions including: obtaining measured data indicating a resistance of the field winding at a plurality of rotor angular positions while the rotor is rotating at a speed below one-hundred revolutions per minute; comparing the measured data indicating the resistance of the field winding at the plurality of rotor angular positions with a threshold resistance range; and indicating a potential fault in the field winding in response to determining the measured data indicating the resistance deviates from the threshold resistance range.

20 Claims, 5 Drawing Sheets

(51) Int. Cl.
*H02K 11/20* (2016.01)
*H02P 29/024* (2016.01)
*H02P 9/00* (2006.01)

(52) U.S. Cl.
CPC .............. *H02P 6/32* (2016.02); *H02P 9/006* (2013.01); *H02P 29/024* (2013.01); *H02P 29/0241* (2016.02)

(56) References Cited

U.S. PATENT DOCUMENTS

| | | | |
|---|---|---|---|
| 6,343,236 B1 | 1/2002 | Gibson et al. | |
| 8,922,652 B2 | 12/2014 | Tadepalli | |
| 9,261,562 B2 | 2/2016 | Lee et al. | |
| 2004/0212392 A1* | 10/2004 | Hauser | G01M 1/22 324/765.01 |
| 2008/0304986 A1* | 12/2008 | Kenyon | H02K 7/083 417/423.12 |
| 2010/0156338 A1* | 6/2010 | Lu | H02P 23/14 318/798 |
| 2011/0018579 A1* | 1/2011 | Stanton | G01R 31/40 324/764.01 |
| 2011/0285252 A1 | 11/2011 | Hyde et al. | |
| 2011/0320169 A1 | 12/2011 | Bal et al. | |
| 2014/0159754 A1* | 6/2014 | Turner | G01R 27/08 324/721 |
| 2015/0115902 A1 | 4/2015 | Panosyan et al. | |
| 2016/0041228 A1* | 2/2016 | Gerada | G01R 31/346 324/765.01 |

OTHER PUBLICATIONS

Unnikrishnan, S., et al., Systems and methods for determining rotor deterioration in a dynamoelectric machine, GE co-pending Application No. 201641021321, filed Jun. 21, 2016.

Extended European Search Report and Opinion issued in connection with corresponding EP Application No. 17165774.5 dated Sep. 6, 2017.

* cited by examiner

DYNAMOELECTRIC MACHINE FAULT MONITORING SYSTEM, COMPUTER PROGRAM PRODUCT AND RELATED METHODS

CROSS-REFERENCE TO RELATED APPLICATION

This application claims priority to U.S. Provisional Patent Application No. 62/320,664, which is hereby incorporated by reference in its entirety.

FIELD OF THE INVENTION

The subject matter disclosed herein relates to dynamoelectric machines. More particularly, the subject matter disclosed herein relates to detecting faults in dynamoelectric machines, such as electric generators.

BACKGROUND OF THE INVENTION

The field windings of synchronous dynamoelectric machines (e.g. motors and generators) can experience reliability issues over time due to wear-out phenomena. In particular the field windings in synchronous generator rotors can experience failure (e.g., poor connection) proximate the field lead(s), one or more braze joint(s), or at another terminal location.

Conventionally, generator field windings are tested manually, by measuring the resistance of the winding via the adjoining slip rings. The resistance is measured eight (8) times, at corresponding angular (rotation) positions of the rotor in order to detect loose connections. In a generator without a field winding fault, these eight measurements should be approximately uniform (e.g., within a given measurement tolerance). As such, the conventional approach includes comparing these eight measurements, and if one or more measurements deviates from the remaining measurements, follow-up is performed on the corresponding location for a likely fault. However, this approach requires on-site measurement of the generator, and time-consuming manual labor.

BRIEF DESCRIPTION OF THE INVENTION

Various embodiments of the disclosure include a system having: at least one computing device configured to monitor a dynamoelectric machine having a rotor including an exciter electrically coupled with a field winding, by performing actions including: obtaining measured data indicating a resistance of the field winding at a plurality of rotor angular positions while the rotor is rotating at a speed below one-hundred revolutions per minute; comparing the measured data indicating the resistance of the field winding at the plurality of rotor angular positions with a threshold resistance range; and indicating a potential fault in the field winding in response to determining the measured data indicating the resistance deviates from the threshold resistance range.

A first aspect of the disclosure includes a system having: at least one computing device configured to monitor a dynamoelectric machine having a rotor including an exciter electrically coupled with a field winding, by performing actions including: obtaining measured data indicating a resistance of the field winding at a plurality of rotor angular positions while the rotor is rotating at a speed below one-hundred revolutions per minute; comparing the measured data indicating the resistance of the field winding at the plurality of rotor angular positions with a threshold resistance range; and indicating a potential fault in the field winding in response to determining the measured data indicating the resistance deviates from the threshold resistance range.

A second aspect of the disclosure includes a system having: a dynamoelectric machine having a rotor including an exciter electrically coupled with a field winding; and a controller coupled to the exciter, the controller configured to monitor the dynamoelectric machine by performing actions including: obtaining measured data indicating a resistance of the field winding at a plurality of rotor angular positions while the rotor is rotating at a speed below one-hundred revolutions per minute; comparing the measured data indicating the resistance of the field winding at the plurality of rotor angular positions with a threshold resistance range; and indicating a potential fault in the field winding in response to determining the measured data indicating the resistance deviates from the threshold resistance range.

A third aspect of the disclosure includes a computer program product having program code, which when executed by at least one computing device, causes the at least one computing device to monitor a dynamoelectric machine having a rotor including an exciter electrically coupled with a field winding, by performing actions including: obtaining measured data indicating a resistance of the field winding at a plurality of rotor angular positions while the rotor is rotating at a speed below one-hundred revolutions per minute; comparing the measured data indicating the resistance of the field winding at the plurality of rotor angular positions with a threshold resistance range; and indicating a potential fault in the field winding in response to determining the measured data indicating the resistance deviates from the threshold resistance range.

A fourth aspect of the disclosure includes a method of monitoring a dynamoelectric machine having a rotor including an exciter electrically coupled with a field winding, the method including: obtaining measured data indicating a resistance of the field winding at a plurality of rotor angular positions while the rotor is rotating at a speed below one-hundred revolutions per minute; comparing the measured data indicating the resistance of the field winding at the plurality of rotor angular positions with a threshold resistance range; and indicating a potential fault in the field winding in response to determining the measured data indicating the resistance deviates from the threshold resistance range.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
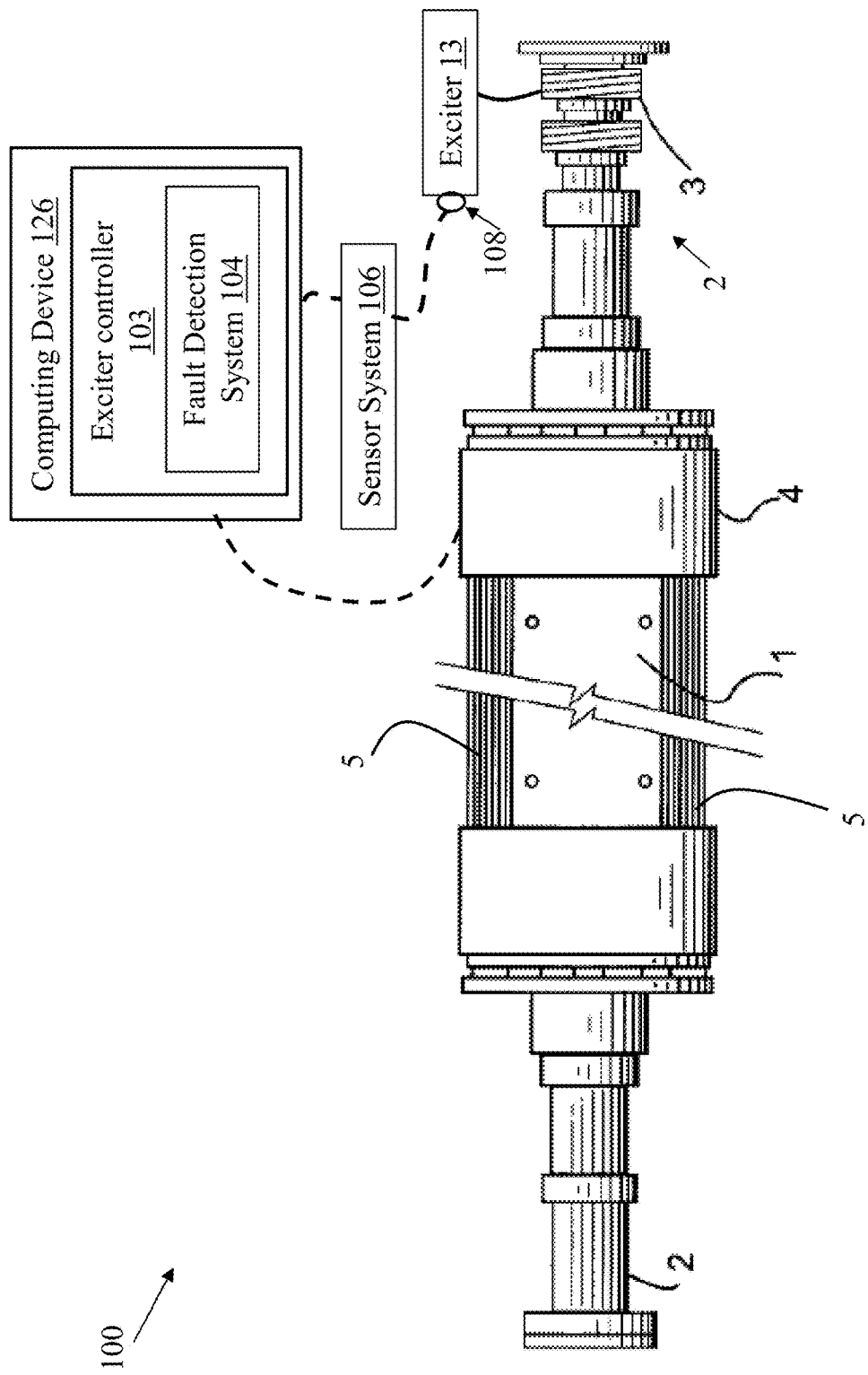
FIG. 1 shows a schematic depiction of a system according to various embodiments of the disclosure.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, the subject matter disclosed herein relates to dynamoelectric machines. More particularly, the subject matter disclosed herein relates to detecting faults in dynamoelectric machines, such as synchronous electric generators and motors.

In contrast to conventional approaches, various embodiments of the disclosure utilize the exciter (and the exciter controller, including its associated software) to monitor resistance values which may indicate a fault (or, in some cases, failure). In particular, various embodiments of the disclosure include an exciter controller configured to obtain resistance data from the exciter, during low-speed operation (e.g., startup or shut-down) of the generator. The exciter controller can compare that exciter resistance data, associated with the field winding on the rotor, to detect a potential fault. Because the exciter is electrically connected with the field winding, distinct resistance values at the exciter, based upon the angle of the rotor, can indicate a potential fault in the field winding. It is understood that measuring the resistance of the field winding is a normal function of the exciter during normal operation at full speed. That is, winding resistance is derived by the ratio of measured voltage/current. The steady state resistance value is used to determine the average temperature of the winding.

In the following description, reference is made to the accompanying drawings that form a part thereof, and in which is shown by way of illustration specific example embodiments in which the present teachings may be practiced. These embodiments are described in sufficient detail to enable those skilled in the art to practice the present teachings and it is to be understood that other embodiments may be utilized and that changes may be made without departing from the scope of the present teachings.

Referring to the drawings, particularly FIG. 1, there is illustrated a system 100, including a dynamoelectric machine rotor (referred to as "dynamoelectric machine" or "rotor" herein) 1, such as a generator rotor, according to various embodiments of the disclosure. The rotor 1 includes end shafts 2 one of which contain insulated conductors, i.e., bore connector bars or "bore copper" that extend longitudinally along the end shafts 2 between the collector ring/slip ring 3 and the rotor field windings located in the rotor body slots 5 and within retaining rings 4. As will be appreciated by one having skill in the art, rotor 1 includes a series of longitudinally extending, radially-opening slots 5, (many shown), having dovetail-shaped, longitudinal grooves in the slot sides adjacent the periphery of rotor 1. Field windings are inserted in the slots and extend the length of the rotor body with longitudinal wedges (not shown) located in the dovetail-shaped grooves for holding the windings in place against centrifugal forces exerted when rotor 1 is at operational speed. The longitudinal sections of the field coils extend in an axial direction beyond the ends of the larger diameter portion of the rotor and include field winding (end turns) 7 (FIG. 2) for connecting a longitudinal section of one slot with a winding of another slot. The retaining ring 4 overlies these windings (end turns) 7 and resists the centrifugal forces on the winding end turns when rotor 1 is at operational speed so as to restrain the end turns from moving in a radially-outwardly direction.

Figure 2:
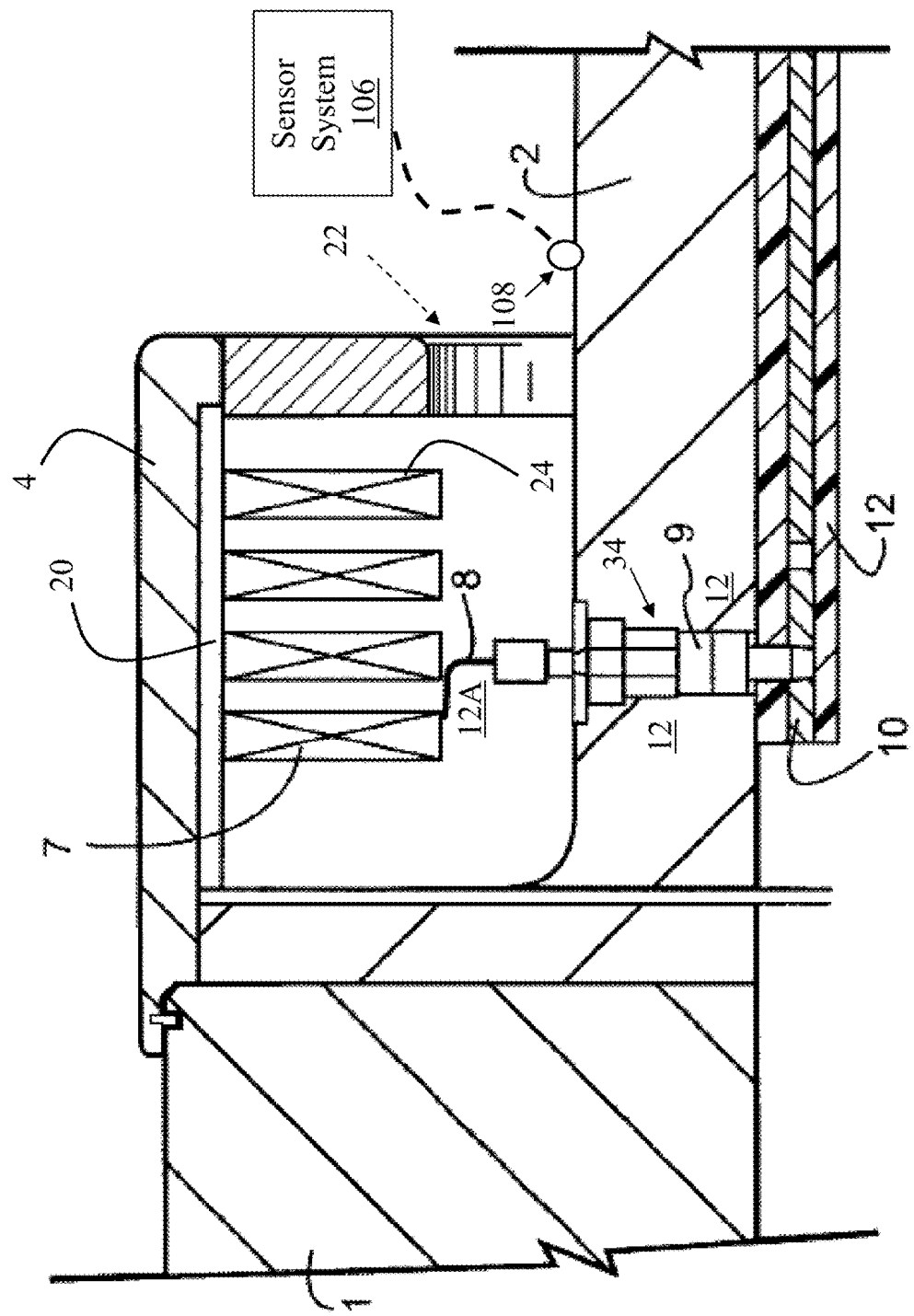
FIG. 2 shows a close-up schematic depiction of a portion of a dynamoelectric machine in the system of FIG. 1.

Referring to FIG. 2, a terminal stud 9 extends between a bore copper 10 and coils in field winding 7. A flexible main lead (or, lead connector) 8 typically connects the radial outer end of terminal stud 9 to an end turn 7. It will be appreciated that bore copper 10 is electrically insulated from rotor 2, for example, by insulation 12. Likewise, terminal stud 9, while conducting electricity between bore copper 10 and windings 7, is likewise electrically insulated from rotor 1 in a conventional manner (insulation 12A insulating terminal stud 9, while lead connector 8 is gas-insulated). It will be appreciated that in the illustration of FIG. 2, the radial opening in bore copper 10 which receives the lower or inner end of terminal stud 9 is may be a tapered, threaded aperture which receives complementary threads on the end of the terminal stud. Alternatively, the lower or inner end of terminal stud 9 is cylindrical and connected to bore copper 10 through other means. As shown in FIGS. 1-2, rotor 1 can include a collector end retaining ring (retaining ring) 4 retaining main lead 8, terminal stud 9 contacting main lead 8, and main terminal insulation (insulation 12) proximate main lead 8. Terminal stud 9 may sit within terminal stud hole 34 in insulation 12. FIG. 2 also illustrates retaining ring insulation 20, and centering ring 22 (shown partially in phantom as removed) for an innermost coil winding 24 inside retaining ring 4.

Figure 3:
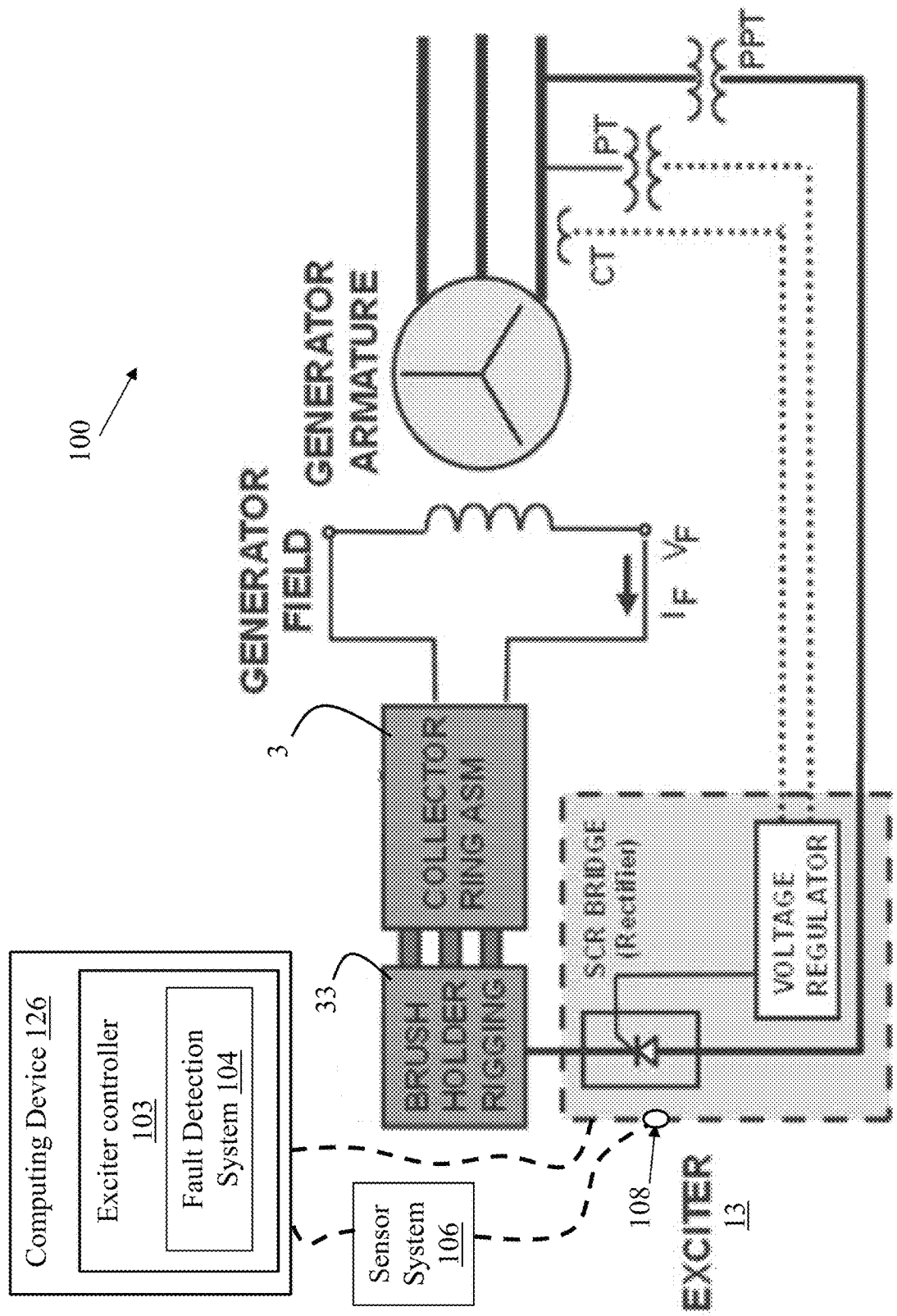
FIG. 3 shows an additional schematic depiction of a system including an exciter and a fault detection system, according to various embodiments of the disclosure.

Returning to FIG. 1, system 100 can further include an exciter 13 coupled with collector ring 3 (illustrated in more detail in FIG. 3). System 100 can also include an exciter controller 103 coupled with exciter 13 and configured to control and/or monitor exciter 13. It is understood that according to various embodiments, exciter controller 102, including computing device 126, can be physically housed within a excitation system along with exciter. Exciter controller 103 can include a fault detection system 104 configured to compare resistances measured at exciter 13, e.g., via a multimeter or other device configured to measure resistance. Fault detection system 104 can be configured to initiate data gathering (e.g., gathering resistance data) based upon a particular operating state of generator rotor 1. For example, fault detection system 104 can be configured to gather (e.g., log, store or otherwise compile) resistance data from exciter 13 (e.g., via resistance measurement device) in response to detecting a particular operating state of generator rotor 1, e.g., in response to detecting a particular rotating speed of rotor 1. In some cases, during startup of the generator (where operating speed of rotor 1 is at or below a threshold RPM level), shutdown, or low-speed operation, fault detection system 104 can obtain resistance data as a function of rotor angular position from a resistance measurement device, and compare that resistance data to identify one or more outliers. The outlier(s) can include resistance measurements that deviate from an average of the remaining resistance measurements (or an expected resistance measurement value or range) by a statistically significant amount (e.g., outside of tolerance).

FIG. 3 shows another schematic depiction of a portion of system 100, with particular focus on exciter 13, coupled with collector ring 3 via a brush holder rigging 33. As is known in the art, the brush holder rigging 33 is a stationary component coupled with the rotating collector ring 3 and exciter 13. Exciter 13 includes a voltage regulator and a rectifier, as is known in the art. FIG. 3 shows sensor 108 coupled with exciter 13, connecting sensor system 106 to exciter 13. As described herein, computing device 126 (including exciter controller 103 and fault detection system 104) may be physically housed with exciter 13, e.g., in an excitation control system. Separation/grouping of these components is shown merely for illustrative purposes, and it is understood that these Figures are not to scale.

Figure 5:
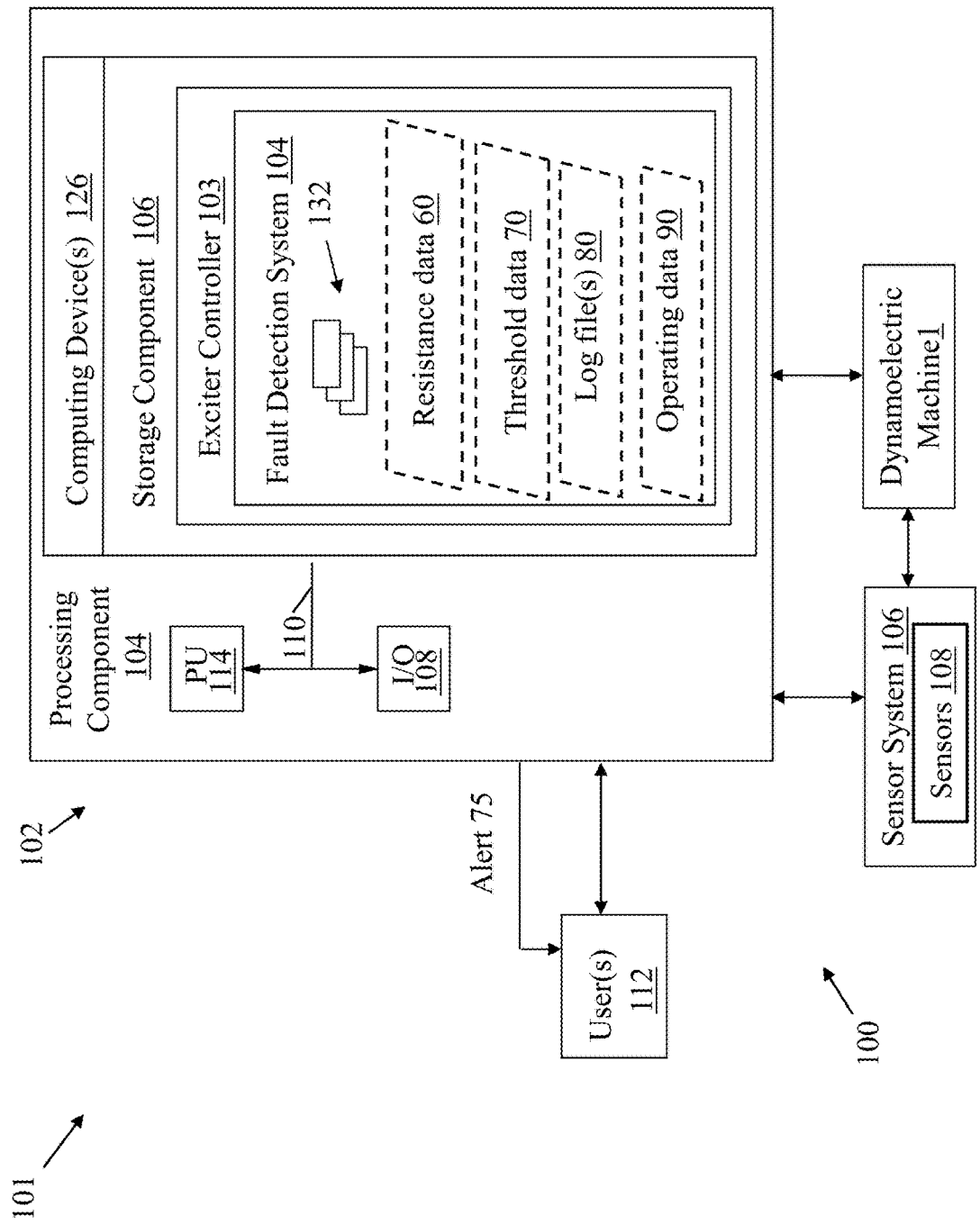
FIG. 5 shows an environment including a system for monitoring the dynamoelectric machine of FIG. 1, according to various embodiments of the disclosure.

As shown in FIG. 1 and FIG. 5, system 100 can include at least one computing device 126 coupled to, and configured to monitor (and in some cases, control), dynamoelectric machine (rotor 1). A sensor system 106 is also shown coupled with computing device 126 and dynamoelectric machine (rotor 1). Computing device(s) 126 can be hard-wired and/or wirelessly connected to dynamoelectric machine (rotor 1) and sensor system 106 via any conventional means. In various embodiments, computing device(s) 126 can include a control system (e.g., exciter controller 103), as described herein, for controlling operations of dynamoelectric machine 1.

Figure 4:
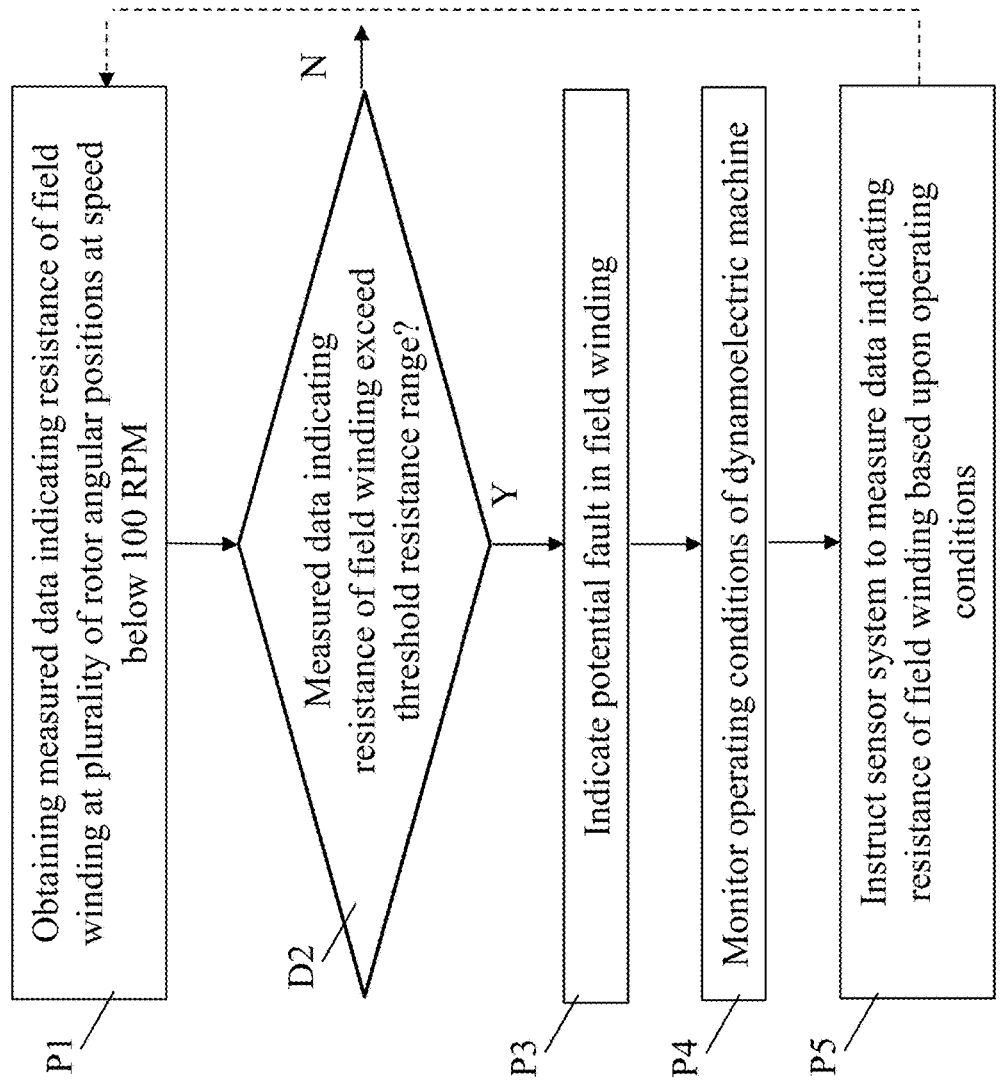
FIG. 4 shows a flow diagram illustrating a method performed according to particular embodiments of the disclosure.

In various embodiments, computing device 126, via fault detection system 104, is configured to perform various functions. FIG. 4 shows a flow diagram illustrating processes performed according to various embodiments of the disclosure. These processes can be performed, e.g., by at least one computing device 126 including exciter controller 103 and fault detection system 104, as described herein. In other cases, these processes can be performed according to a computer-implemented method of monitoring dynamo-electric machine 1. In still other embodiments, these processes can be performed by executing computer program code (e.g., fault detection system 104) to monitor dynamoelectric machine 1. Continuing reference is made to FIG. 1, FIG. 2 and FIG. 3 to illustrate these processes as they relate to system 100. Additional reference is made to environment 101, shown in FIG. 5 and described further herein. As shown in FIG. 4, processes according to embodiments can include the following sub-processes:

Process P1: Obtaining measured data (resistance data 60, FIG. 5) indicating a resistance of field winding 7 at a plurality of rotor angular positions while rotor 2 is rotating at a speed below one-hundred revolutions per minute (RPM). In various embodiment, this can include measuring the resistance (electrical resistance) of the field winding 7 (where the field winding (coils) 7 are electrically coupled with exciter 13 via the main lead 8 and terminal stud 9) while the rotor is rotating at a speed below one-hundred RPM (e.g., below operating speed, but above zero RPM). In various embodiments, a sensor system 106 (FIG. 1, FIG. 2, FIG. 3), coupled with fault detection system 104, includes at least one sensor 108 for measuring a resistance of field winding 7 (including, in connections between field winding 7, main lead 8, terminal stud 9, and/or bore copper 10), providing resistance data 60. Sensor(s) 108 can be connected with rotor 2, in particular, with exciter 13 (FIG. 1), and can measure electrical resistance of the field windings 7 (at a plurality of angular positions, while rotor 2 is rotated) via the main lead 8 and terminal stud 9 connection. In some cases, sensor(s) 108 can include one or more low-resistance ohm meters (e.g., digital low-resistance ohm meter) or bridges, or another device capable of measuring electrical resistance.

Process D2: comparing the measured data indicating the resistance of the field winding 7 (including, in connections between field winding 7, main lead 8, terminal stud 9, and/or bore copper 10) (resistance data 60, FIG. 5) at a plurality of angular positions with a threshold resistance range (threshold data 70, FIG. 5). In various embodiments, the threshold resistance range (threshold data 70) is based upon a historical resistance range for the dynamoelectric machine 1, e.g., a measured or modeled set of desired resistance values for field windings 7, which may be based at least in part upon the model and/or output of dynamoelectric machine 1. In various embodiments, resistance data 60 can indicate a resistance of the field winding 7, at a plurality of rotor angles, such that a resistance of field winding 7 is measured at a plurality of angular positions. In these cases, fault detection system 104 may use resistance data 60 to calculate a statistical distribution of the resistance across the field winding 7. This statistical distribution can define the threshold resistance range (threshold data 70), e.g., within one or more standard deviations from the mean of resistance data 60. In various embodiments, the threshold resistance range (threshold data 70) can be a percentage range of resistance values (e.g., a dimensionless ratio). In other cases, the threshold resistance range (threshold data 70) could be a range of resistance values representing a desired resistance for field windings 7.

Process P3 (Yes to decision D2): indicating a potential fault in the field winding 7 (including, in connections between field winding 7, main lead 8, terminal stud 9, and/or bore copper 10) in response to determining measured data indicating the resistance (resistance data 60) deviates from the threshold resistance range (threshold data 70). In various embodiments, fault detection system 104 can indicate the potential fault in field winding(s) 7 (including, in connections between field winding 7, main lead 8, terminal stud 9, and/or bore copper 10) by providing an alert 75 (FIG. 5) to an interface (e.g., I/O 108, FIG. 5) coupled with computing device 126. In other cases, fault detection system 104 can log the potential fault in a log file 80 about dynamoelectric machine 1. In the case that decision D2 is answered in the negative (No), the method can return to process P1. As described herein, it is understood that in various embodiments, process P2 can include detecting a fault (e.g., detecting a loose or otherwise deficient connection) between field winding 7, main lead 8, terminal stud 9 and/or bore copper 10. In various particular embodiments, this process can include detecting a potential fault in the connection between terminal stud 9 and bore copper 10.

In some cases, fault detection system 104 is further configured to perform additional processes:

Process P4: monitor operating conditions of dynamoelectric machine 1 (stored or otherwise represented as operating data 90). In some cases, operating conditions can include one or more of output, rotor speed, fluid pressure (e.g., of a cooling fluid, such as air), etc. In various embodiments exciter controller 103 includes conventional sensor equipment to monitor operating conditions of dynamoelectric machine 1. In other embodiments, sensor system 106 includes a set of conventional sensors for monitoring one or more of output, rotor speed, fluid pressure, etc.

Process P5: instruct sensor system 106 to measure resistance data 60 about field windings 7 based upon at least one of the operating conditions (operating data 90) of dynamoelectric machine 1. In some cases, where operating condition(s) include rotor speed, fault detection system 104 is configured to instruct sensor system 106 to measure resistance data 60 about field winding(s) 7 in response to determining that the rotor speed is below a threshold (rotor) speed. For example, when operating data 90 indicates that the speed of dynamoelectric machine (rotor) 1 is approaching or below a particular revolution-per-minute (RPM) level, fault detection system 104 may initiate data gathering, via sensor system 106 about resistance of field windings 7 in order to detect a potential fault in those winding(s) 7.

It is understood that processes P1-P5, can be iterated on a periodic, or constant basis. Further, processes P1-P5 can be performed in response to particular operating conditions of the dynamoelectric machine 1, for example, when a startup operation is initiated (e.g., control instructions for startup are obtained), or when a ramp-up is initiated (e.g., control instructions for increased output are obtained). Additionally, these processes can be repeated according to any schedule to monitor dynamoelectric machine 1 as described herein.

It is understood that in the flow diagrams shown and described herein, other processes may be performed while not being shown, and the order of processes can be rearranged according to various embodiments. Additionally, intermediate processes may be performed between one or more described processes. The flow of processes shown and described herein is not to be construed as limiting of the various embodiments.

FIG. 5 shows an illustrative environment 101 including fault detection system 104, for performing the functions described herein according to various embodiments of the invention. To this extent, the environment 101 includes a computer system 102 that can perform one or more processes described herein in order to monitor and/or control system 10 (FIG. 1, FIG. 3). In particular, the computer system 102 is shown as including the fault detection system 104, which makes computer system 102 operable to control/monitor operation of dynamoelectric machine 1 by performing any/all of the processes described herein and implementing any/all of the embodiments described herein.

The computer system 102 is shown including computing device 126, which can include a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the fault detection system 104, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human and/or computerized user) 112 to interact with the computer system 102 and/or one or more communications devices to enable the system user 112 to communicate with the computer system 102 using any type of communications link. To this extent, the fault detection system 104 can manage a set of interfaces (e.g., graphical user interface(s), application program interface, etc.) that enable human and/or system users 112 to interact with the fault detection system 104. Further, the fault detection system 104 can manage (e.g., store, retrieve, create, manipulate, organize, present, etc.) data, such as resistance data 60, threshold data 70, log file(s) 80 and/or operating data 90 using any solution, e.g., via wireless and/or hardwired means.

In any event, the computer system 102 can comprise one or more general purpose computing articles of manufacture (e.g., computing devices) capable of executing program code, such as the fault detection system 104, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the fault detection system 104 can be embodied as any combination of system software and/or application software. It is further understood that the fault detection system 104 can be implemented in a cloud-based computing environment, where one or more processes are performed at distinct computing devices (e.g., a plurality of computing devices 126), where one or more of those distinct computing devices may contain only some of the components shown and described with respect to the computing device 126 of FIG. 5.

Further, fault detection system 104 can be implemented using a set of modules 132. In this case, a module 132 can enable the computer system 102 to perform a set of tasks used by the fault detection system 104, and can be separately developed and/or implemented apart from other portions of the fault detection system 104. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of fault detection system 104 fixed thereon (e.g., one or more modules 132). However, it is understood that the computer system 102 and fault detection system 104 are only representative of various possible equivalent computer systems that may perform a process described herein. To this extent, in other embodiments, the functionality provided by the computer system 102 and fault detection system 104 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices 26, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

While shown and described herein as a method and system for monitoring operation of a dynamoelectric machine 1 (FIG. 5), it is understood that aspects of the invention further provide various alternative embodiments. For example, in one embodiment, the invention provides a computer program fixed in at least one computer-readable medium, which when executed, enables a computer system to monitor operation of dynamoelectric machine 1. To this extent, the computer-readable medium includes program code, such as the fault detection system 104 (FIG. 5), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the fault detection system 104 (FIG. 5), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of monitoring operation of a dynamoelectric machine 1 (FIG. 1). In this case, a computer system, such as the computer system 102 (FIG. 5), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or 110 devices to the computer system; (3) incorporating and/or modifying the computer system to enable it to perform a process described herein; etc.

In any case, the technical effect of the various embodiments of the disclosure, including, e.g., fault detection system 104, is to monitor a dynamoelectric machine, e.g., for potential faults. It is understood that according to various embodiments, fault detection system 104 could be implemented to monitor a plurality of dynamoelectric machines, such as dynamoelectric machine 1 described herein.

In various embodiments, components described as being "coupled" to one another can be joined along one or more interfaces. In some embodiments, these interfaces can include junctions between distinct components, and in other cases, these interfaces can include a solidly and/or integrally formed interconnection. That is, in some cases, components that are "coupled" to one another can be simultaneously formed to define a single continuous member. However, in other embodiments, these coupled components can be formed as separate members and be subsequently joined through known processes (e.g., fastening, ultrasonic welding, bonding).

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:
1. A system comprising:
at least one computing device configured to monitor a dynamoelectric machine having a rotor including an exciter electrically coupled with a field winding, by performing actions including:
obtaining measured data indicating a resistance of the field winding at a plurality of rotor angular positions while the rotor is rotating at a speed below one-hundred revolutions per minute;
comparing the measured data indicating the resistance of the field winding at the plurality of rotor angular positions with a threshold resistance range; and
indicating a potential fault in the field winding in response to determining the measured data indicating the resistance deviates from the threshold resistance range.

2. The system of claim 1, wherein the threshold resistance range is based upon a historical resistance range for the dynamoelectric machine.

3. The system of claim 1, wherein the at least one computing device is configured to define the threshold resistance range based upon a statistical distribution of the measured data indicating the resistance of the field winding.

4. The system of claim 1, wherein the indicating of the potential fault includes providing an alert to an interface coupled with the at least one computing device, or logging the potential fault in a log file about the dynamoelectric machine.

5. The system of claim 1, further comprising a sensor system coupled with the dynamoelectric machine and the at least one computing device.

6. The system of claim 5, wherein the measured data indicating the resistance of the field winding is obtained from the sensor system.

7. The system of claim 6, wherein the sensor system includes an ohm meter or a bridge coupled with the exciter.

8. The system of claim 5, wherein the at least one computing device is further configured to:
monitor operating conditions of the dynamoelectric machine; and
instruct the sensor system to measure the data indicating the resistance of the field winding based upon one of the operating conditions of the dynamoelectric machine,
wherein the one of the operating conditions includes a rotor speed, and wherein the at least one computing device is configured to instruct the sensor system to measure the data indicating the resistance of the field winding in response to determining the rotor speed is below one-hundred revolutions per minute.

9. The system of claim 8, wherein the measured data is obtained by measuring the resistance of the field winding via a main lead and terminal stud connection during at least one of startup or shutdown of the dynamoelectric machine, and wherein the at least one computing device instructs the sensor system to measure the data indicating the resistance of the field winding only in response to determining that the rotor speed is below one-hundred revolutions per minute.

10. A system comprising:
a dynamoelectric machine having a rotor including an exciter electrically coupled with a field winding; and
a controller coupled to the exciter, the controller configured to monitor the dynamoelectric machine by performing actions including:
obtaining measured data indicating a resistance of the field winding at a plurality of rotor angular positions while the rotor is rotating at a speed below one-hundred revolutions per minute;
comparing the measured data indicating the resistance of the field winding at the plurality of rotor angular positions with a threshold resistance range; and
indicating a potential fault in the field winding in response to determining the measured data indicating the resistance deviates from the threshold resistance range.

11. The system of claim 10, wherein the threshold resistance range is based upon a historical resistance range for the dynamoelectric machine.

12. The system of claim 10, wherein the controller is configured to define the threshold resistance range based upon a statistical distribution of the measured data indicating the resistance of the field winding.

13. The system of claim 10, wherein the controller includes an interface, and the indicating of the potential fault includes providing an alert to the interface, or logging the potential fault in a log file about the dynamoelectric machine.

14. The system of claim 10, further comprising a sensor system coupled with the dynamoelectric machine and the controller.

15. The system of claim 14, wherein the measured data indicating the resistance of the field winding is obtained from the sensor system.

16. The system of claim 15, wherein the controller is further configured to:
monitor operating conditions of the dynamoelectric machine; and
instruct the sensor system to measure the data indicating the resistance of the field winding based upon one of the operating conditions of the dynamoelectric machine,
wherein the one of the operating conditions includes a rotor speed, and wherein the controller is configured to instruct the sensor system to measure the data indicating the resistance of the field winding in response to determining that the rotor speed is below one-hundred revolutions per minute.

17. The system of claim 16, wherein the measured data is obtained by measuring the resistance of the field winding via a main lead and terminal stud connection during at least one of startup or shutdown of the dynamoelectric machine, and wherein the controller instructs the sensor system to measure the data indicating the resistance of the field winding only in response to determining that the rotor speed is below one-hundred revolutions per minute.

18. A computer program product comprising program code, which when executed by at least one computing device, causes the at least one computing device to monitor a dynamoelectric machine having a rotor including an exciter electrically coupled with a field winding, by performing actions including:
obtaining measured data indicating a resistance of the field winding at a plurality of rotor angular positions while the rotor is rotating at a speed below one-hundred revolutions per minute;
comparing the measured data indicating the resistance of the field winding at the plurality of rotor angular positions with a threshold resistance range; and
indicating a potential fault in the field winding in response to determining the measured data indicating the resistance deviates from the threshold resistance range.

19. The computer program product of claim 18, wherein the program code further causes the at least one computing device to:
monitor operating conditions of the dynamoelectric machine; and
instruct a sensor system, coupled with the at least one computing device and the dynamoelectric machine, to measure the data indicating the resistance of the field winding based upon at least one of the monitored operating conditions,
wherein the at least one of the monitored operating conditions includes a rotor speed, and wherein the at least one computing device is configured to instruct the sensor system to measure the data indicating the resistance of the field winding in response to determining that the rotor speed is below one-hundred revolutions per minute.

20. The computer program product of claim 19, wherein the measured data is obtained by measuring the resistance of the field winding via a main lead and terminal stud connection during at least one of startup or shutdown of the dynamoelectric machine, and wherein the at least one computing device instructs the sensor system to measure the data indicating the resistance of the field winding only in response to determining that the rotor speed is below one-hundred revolutions per minute.

* * * * *